United States Patent
Kim et al.

(10) Patent No.: US 6,295,244 B1
(45) Date of Patent: Sep. 25, 2001

(54) SEMICONDUCTOR MEMORY DEVICE AND DATA READ METHOD THEREOF

(75) Inventors: Young Tae Kim, Suwon; Deok Joon Shin, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/617,524

(22) Filed: Jul. 17, 2000

(30) Foreign Application Priority Data

Jul. 15, 1999 (KR) ................................................ 99-28722

(51) Int. Cl.$^7$ ...................................................... G11C 8/00
(52) U.S. Cl. ............................... 365/230.03; 365/189.05; 365/205; 365/63
(58) Field of Search ............................... 365/230.03, 205, 365/189.05, 51, 63

(56) References Cited

U.S. PATENT DOCUMENTS 5,517,461 * 5/1996 Umo et al. ..................... 365/189.05
5,592,435   1/1997 Mills et al. .

5,812,490 * 9/1998 Tsukude ..................... 365/230.03 X

\* cited by examiner

Primary Examiner—Huan Hoang
(74) Attorney, Agent, or Firm—Marger Johnson & McCollom, P.C.

(57) ABSTRACT

The present invention discloses a semiconductor memory device. The device includes a plurality of memory cell array blocks; a predetermined number of main buffers for resetting a predetermined number of pairs of main data lines corresponding to a predetermined number of pairs of data items output from each of the plurality of memory cell array blocks in response to a main buffer control signal, and for generating a predetermined number of pairs of data when the data of each of the predetermined number of pairs of main data lines become complementary levels, the predetermined number of pair of data being reset after a lapse of predetermined time; a predetermined number of data output buffers for respectively receiving and buffering the predetermined number of pairs of data items generated by the predetermined number of main buffers, in response to a data output buffer control signal; and data output buffer control signal generating means for generating the data output buffer control signal, the data output buffer control signal being enabled in response to a control signal and disabled after a lapse of predetermined time from the point of time at which each of the pair of data items output from the predetermined number of main buffers reaches the desired complementary levels, thereby improving data read speed.

14 Claims, 11 Drawing Sheets

SEMICONDUCTOR MEMORY DEVICE AND DATA READ METHOD THEREOF

FIELD OF THE INVENTION

The present invention relates to a semiconductor memory device and, more particularly, to a semiconductor memory device and a data read method thereof whose data read speed can be improved in the case of its read operation.

DISCUSSION OF RELATED ART

The data read circuit in a conventional semiconductor memory device consists of a sense amplifier, a main buffer, a dynamic/static converter and a data output buffer. Therefore, in a data read operation, the conventional semiconductor device outputs data output from memory cell array blocks, through the sense amplifier, main buffer, dynamic/static converter and data output buffer. That is, the conventional semiconductor memory device includes the dynamic/static converter disposed between the main buffer and data output buffer, to convert dynamic data output from the main buffer into static data, and then to send it to the data output buffer. This allows the data output buffer to stably latch the data according to a data output buffer control signal KPIPE. However, the conventional semiconductor memory device has a longer data read path because it comprises the dynamic/static converter, delaying its data read speed.

SUMMARY OF THE INVENTION

Accordingly, the present invention is directed to a semiconductor memory device and a data read method thereof that substantially overcomes one or more of the problems characterizing the prior art.

An object of the present invention is to provide a semiconductor memory device whose data read speed can be improved in the case of a data read operation.

Another object of the present invention is to provide a data read method of a semiconductor memory device whose data read speed can be improved in the case of a data read operation.

To accomplish the object of the present invention, there is provided a semiconductor memory device which comprises: a plurality of memory cell array blocks; a predetermined number of main buffers for resetting a predetermined number of pair of main data lines corresponding to a predetermined number of pairs of data output from each of the plurality of memory cell array blocks in response to a main buffer control signal, and for generating a predetermined number of pairs of data having complementary levels when the data of each of the predetermined number of pairs of main data lines reach complementary levels, the predetermined number of pairs of data items being reset after a lapse of a predetermined time; a predetermined number of data output buffers for receiving and buffering the predetermined number of pair of data generated from each of the predetermined number of main buffers, in response to a data output buffer control signal; and data output buffer control signal generating means for generating the data output buffer control signal being enabled in response to a control signal and disabled after a lapse of a predetermined time from the point of time at which each of the pair of data output from the predetermined number of main buffers reaches the stable complementary levels.

To accomplish the other object of the present invention, there is provided a data read method in a semiconductor memory device comprising a plurality of memory cell array blocks, the method comprising the steps of: amplifying a predetermined number of pairs of data output from each of the plurality of memory cell array blocks in response to a first control signal, to generate a first pair of data; resetting the first pair of data and generating a second pair of data whose level is converted when the first pair of data reaches stable complementary levels in response to a second control signal, the second pair of data being reset after a lapse of a predetermined time; and buffering and outputting of the second pair of data in response to a fourth control signal, the fourth control signal being enabled in response to a third control signal, the fourth control signal converting its level when the second pair of data reaches the stable complementary levels, and then being disabled after a lapse of a predetermined time.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 1 block diagram of an embodiment for explaining a data read method in a conventional semiconductor memory device;

Figure 7:
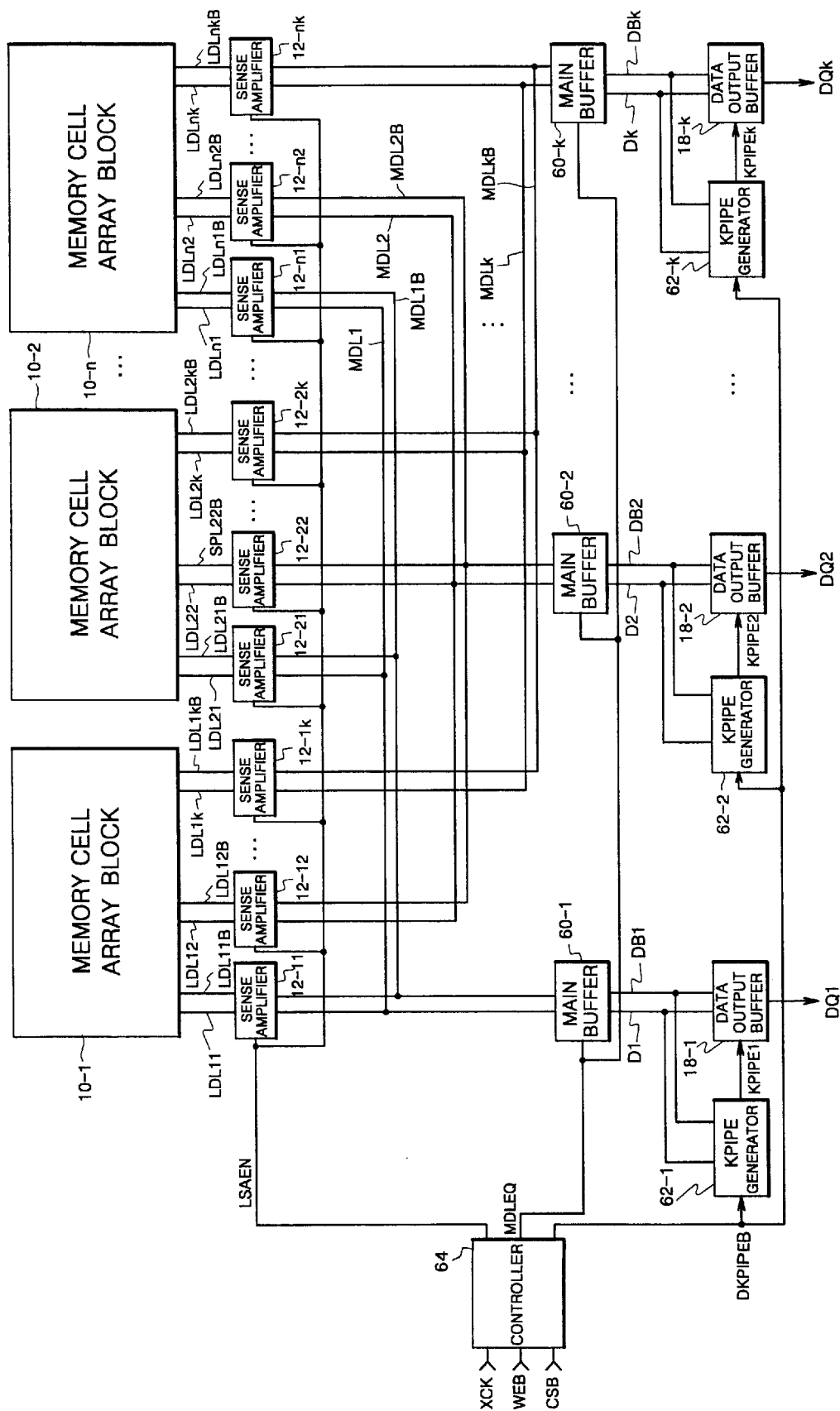
FIG. 7 is a block diagram for explaining a data read method in a semiconductor memory device according to the present invention.
Figure 8:
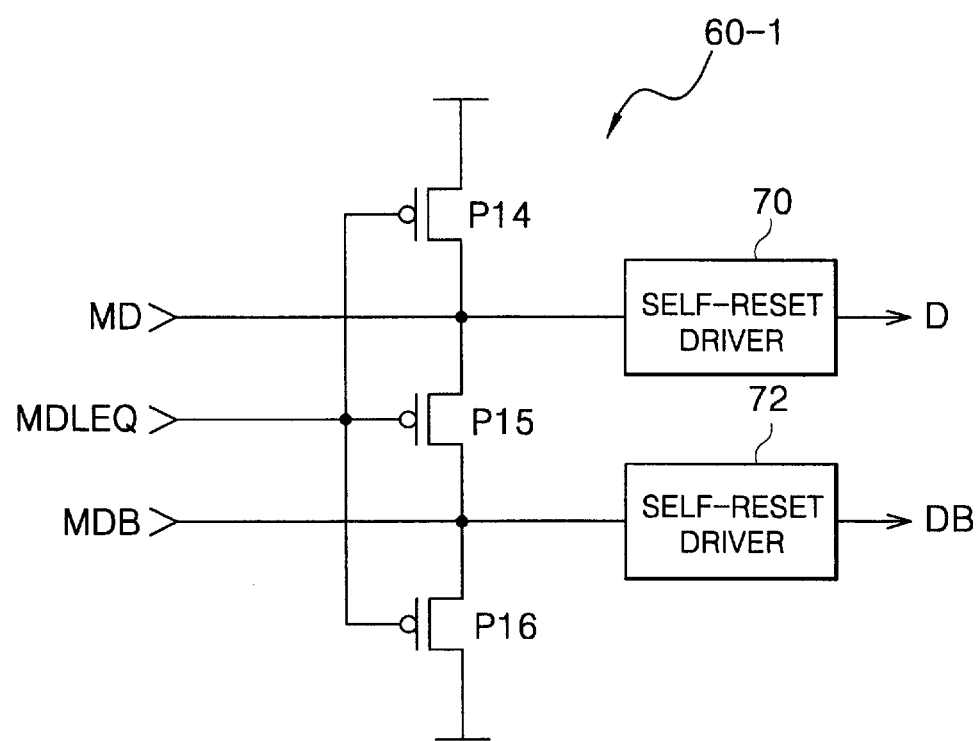
Figure 9:
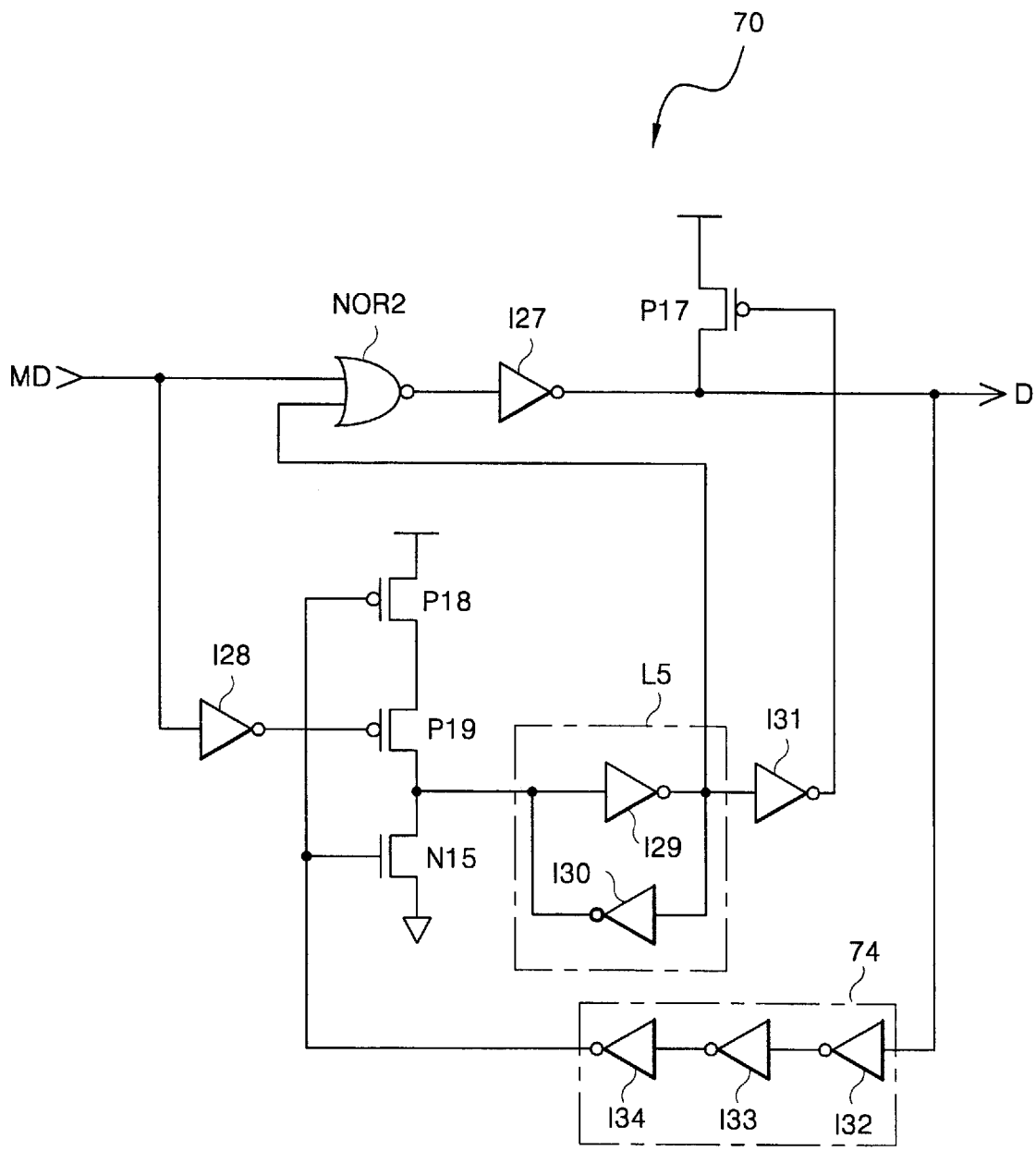
Figure 10:
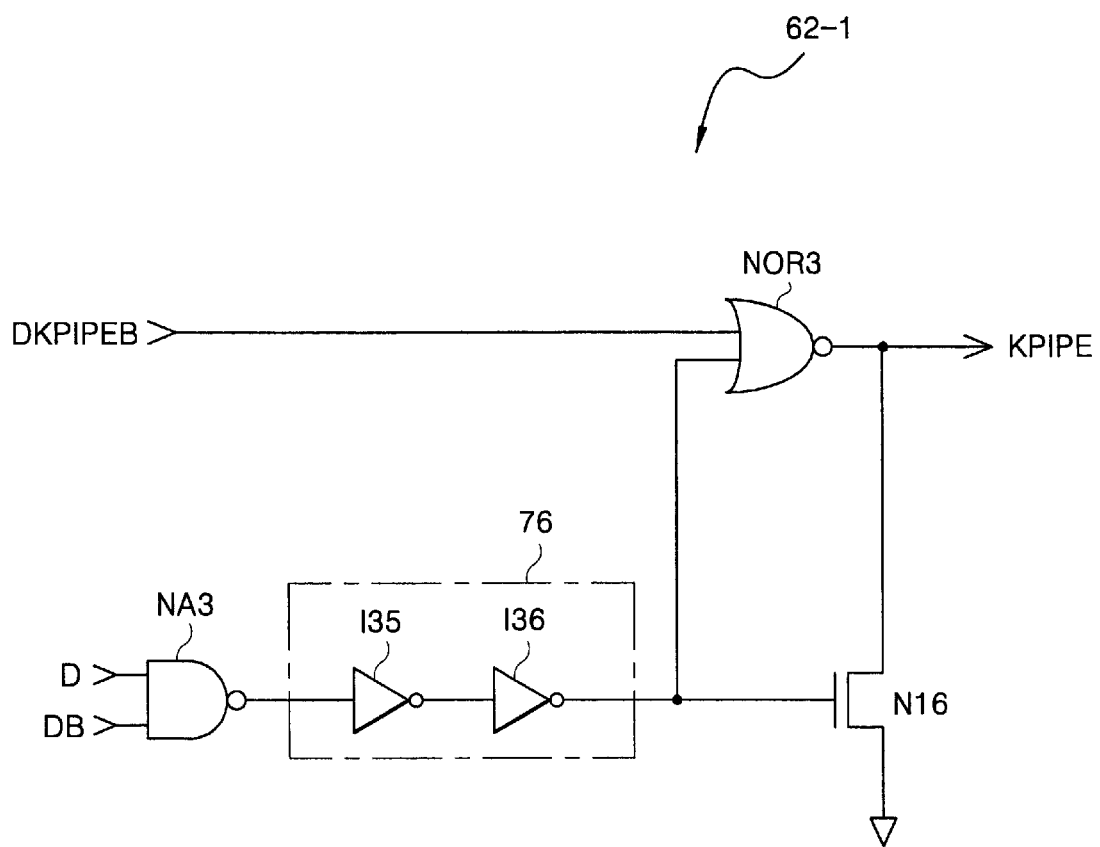
Figure 11:
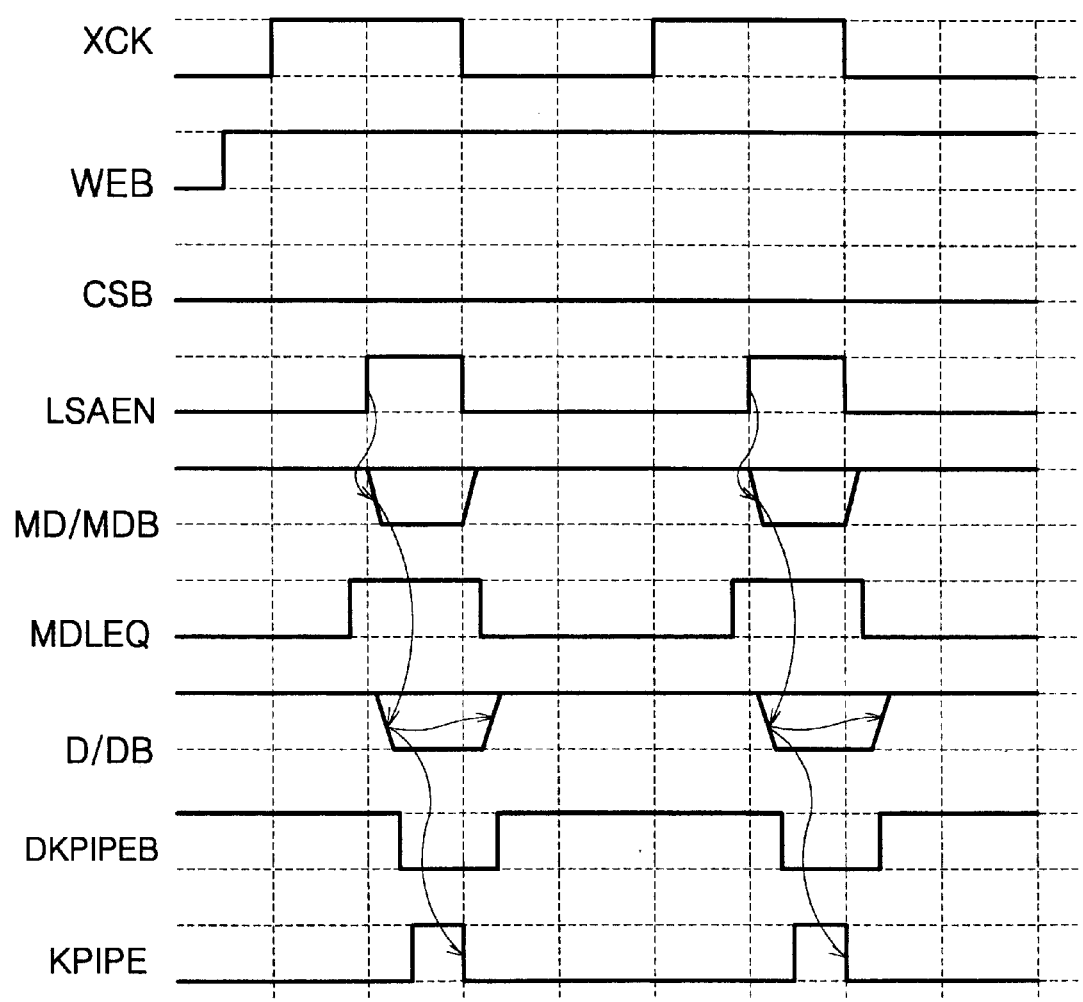

FIG. 8 a circuit diagram of an embodiment of the main buffer shown in FIG. 7;

FIG. 9 is a circuit diagram of an embodiment of the self-reset driver shown in FIG. 7;

FIG. 10 is a circuit diagram of an embodiment of the control signal generator shown in FIG. 7; and FIG. 11 is a timing chart for explaining the operation of the semiconductor memory device of the present invention shown in FIG. 7.

DETAILED DESCRIPTION OF PREFERRED EMBODIMENT

A conventional semiconductor memory device and data read method in this device will be explained below with reference to the attached drawings before description of the semiconductor memory device and data read method in this device according to the present invention.

Figure 1:
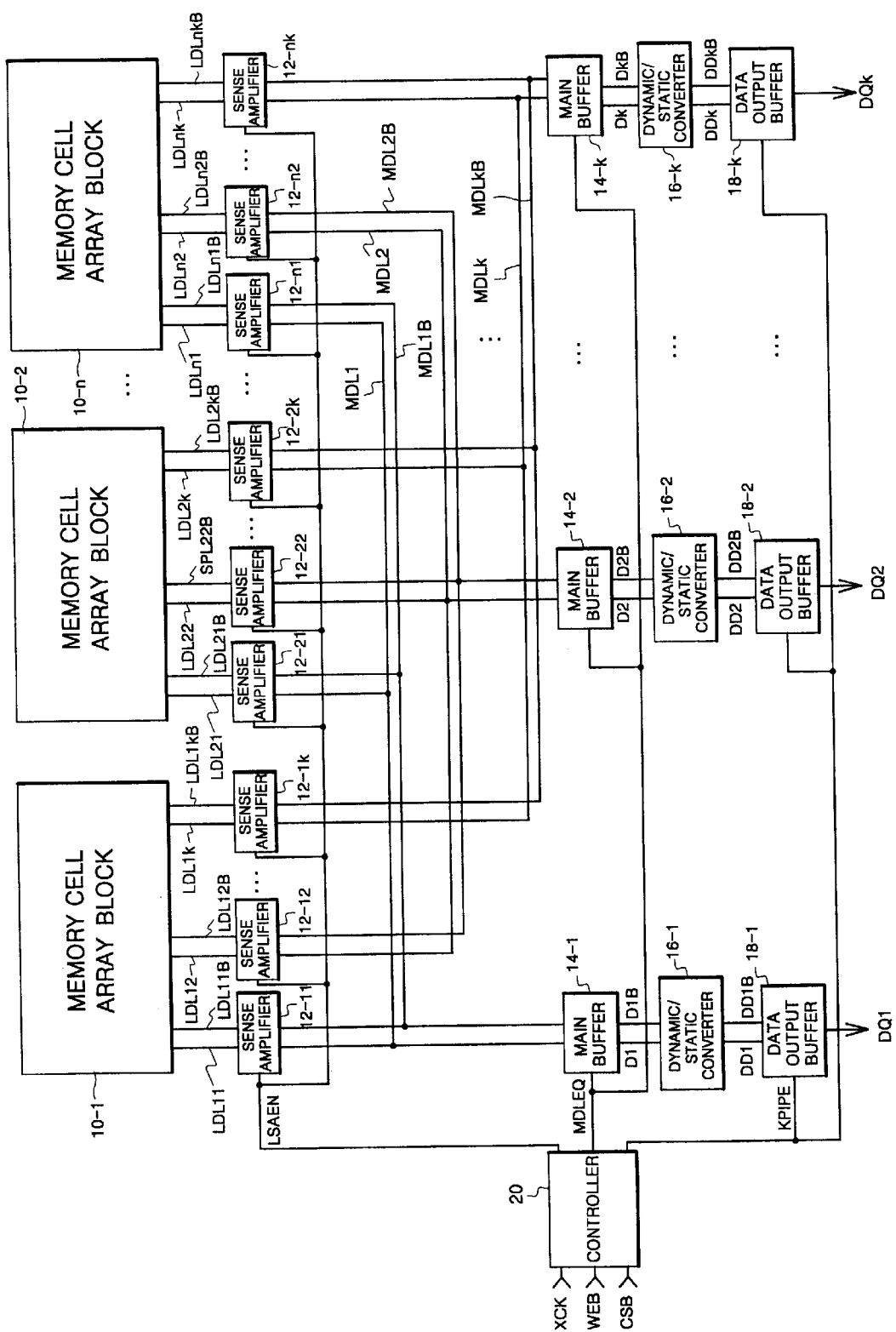

FIG. 1 is a block diagram of an embodiment for explaining a data read method in the conventional semiconductor memory device. Referring to FIG. 1, the conventional semiconductor memory device includes n memory cell array blocks 10-1, 10-2, . . . , 10-n, n groups of k sense amplifiers (12-11, 12-12, . . . , 12-1k), (12-21, 12-22, . . . , 12-2k), . . . , (12-n1, 12-n2, . . . , 12-nk), k main buffers 14-1, 14-2, . . . , 14-k, k dynamic/static converters 16-1, 16-2, . . . , 16-k, k data output buffers 18-1, 18-2, . . . , 18-k, and a controller 20.

There is explained below the operation of each of the circuit blocks of FIG. 1. The n memory cell array blocks 10-1, 10-2, . . . , 10-n output data stored in their corresponding memory cells to the n groups of k sense amplifiers (12-11, 12-12, . . . , 12-1k), (12-21, 12-22, . . . , 12-2k), . . . , (12-n1, 12-n2, . . . , 12-nk) respectively in a data read operation. Data from a selected memory cell array block are transferred to a corresponding pair of local data lines. In other words, data from the memory cell array block 10-1 is transferred to the k pairs of local data lines (LDL11, LDL11B), (LDL12, LDL12B), . . . , (LDL1k, LDL1kB) while data from the memory cell array block 10-n is transferred to the k pairs of local data lines (LDLn1, LDLn1B), (LDLn2, LDLn2B), . . . , (LDLnk, LDLnkB).

The k sense amplifiers within the n groups (12-11, 12-12, . . . , 12-1k), (12-21, 12-22, . . . , 12-2k), . . . , (12-n1, 12-n2, . . . , 12-nk) amplify the pairs of data signals delivered through the corresponding pairs of local data lines in response to a control signal LSAEN, and output them to the k corresponding pairs of main data lines (MDL1, MDL1B), (MDL2, MDL2B), . . . , (MDLk, MDLkB), respectively. The k main buffers 14-1, 14-2, . . . , 14-k buffer the pairs of data transferred through the corresponding pairs of main data lines in response to a control signal MDLEQ, and output them as pairs of data (D1, D1B), (D2, D2B), . . . , (Dk, DkB), respectively. The k dynamic/static converters 16-1, 16-2, . . . , 16-k convert the pairs of dynamic data (D1, D1B), (D2, D2B), . . . , (Dk, DkB) transferred from the corresponding main buffers 14-1, 14-2, . . . , 14-k into k pairs of static data (DD1, DD1B), (DD2, DD2B), . . . , (DDk, DDkb), respectively.

The k data output buffers 18-1, 18-2, . . . , 18-k latch and buffer the k pairs of data (DD1, DD1B), (DD2, DD2B), . . . , (DDk, DDkB) in response to a control signal KPIPE, to generate k output data items DQ1, DQ2, . . . , DQk, respectively. The controller 20 generates control signals LSAEN, MDLEQ, and KPIPE in response to a clock signal XCK, an inverted write enable signal WEB and an inverted chip select signal CSB which are externally applied thereto. That is, the controller 20 generates the control signals LSAEN, MDLEQ, and KPIPE in order to perform the read operation when the inverted write enable signal WEB is at a high level, the inverted chip select signal CSB is at a low level and the clock signal XCK is applied thereto.

Figure 2:
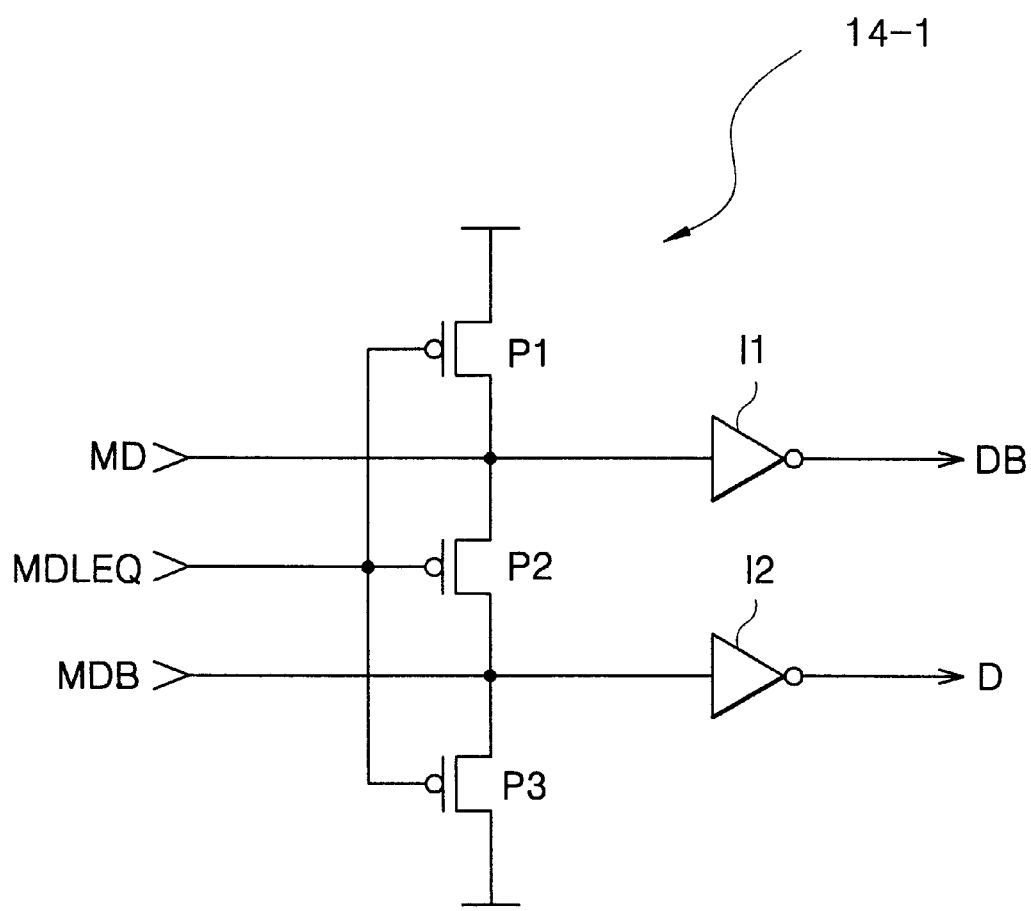
FIG. 2 is a circuit diagram of an embodiment of the main buffer shown in FIG. 1.

FIG. 2 is a circuit diagram of an embodiment of the main buffer shown in FIG. 1. As shown in FIG. 2, the main buffer includes PMOS transistors P1, P2 and P3 and inverters I1 and I2. In FIG. 2, MD and MDB designate one of the pairs of signals transferred through the pair of main data lines MDLk and MDLkB (refer to FIG. 1), respectively. The operation of the main buffer is described below.

When no memory read operation is to be performed, the control signal MDLEQ is at a low level. Accordingly, all the PMOS transistors P1, P2 and P3 are turned on, and generate high level outputs. Then, the inverters I1 and I2 invert the high level signals and generate the pair of data signals D and DB, respectively, of a low level. On the other hand, when a memory read is to be performed, the control signal MDLEQ becomes a high level. Accordingly, all PMOS transistors P1, P2 and P3 are turned off, and the inverters I1 and I2 invert the pair of data signals MD and MDB to generate the pair of data signals DB and D, respectively.

Figure 3:
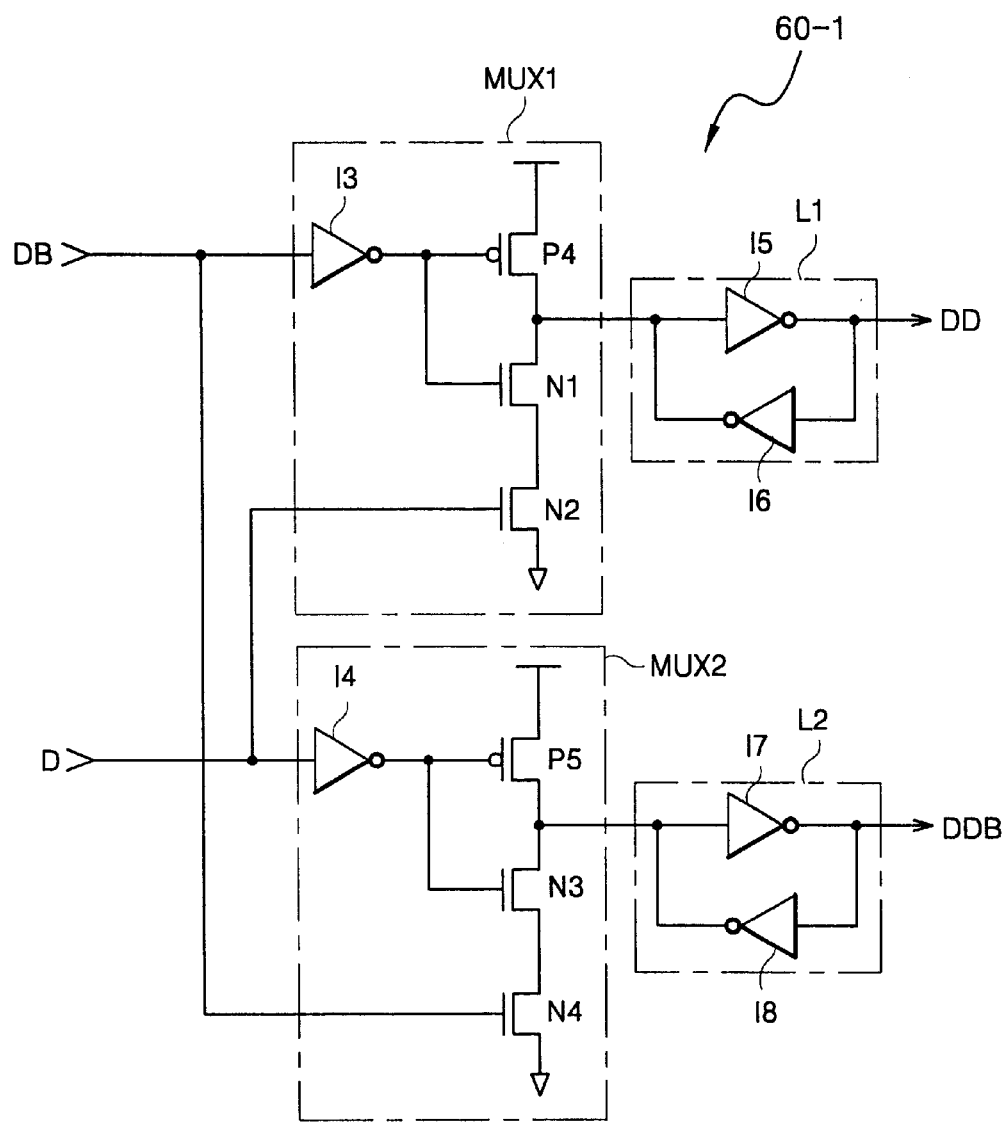
FIG. 3 is a circuit diagram of an embodiment of the dynamic/static converter shown in FIG. 1.

FIG. 3 is a circuit diagram of an embodiment of the dynamic/static converter shown in FIG. 1. The dynamic/static converter comprises a multiplexer MUX1 including an inverter I3, a PMOS transistor P4 and NMOS transistors N1 and N2; a multiplexer MUX2 including an inverter I4, a PMOS transistor P5 and NMOS transistors N3 and N4; a latch L1 including inverters I5 and I6; and a latch L2 including inverters I7 and I8. The operation of the dynamic/static converter is described below.

In the non-read operational state, the pair of data DB and D are low, and the inverters I3 and I4 generate high level signals. Then, the NMOS transistors N1 and N3 are turned on, and the multiplexers MUX1 and MUX2 are disabled. Accordingly, the latches L1 and L2 output data which are previously latched as the pair of data DD and DDB, respectively.

In the case of the read operation, when the pair of data DB and D are the high level and the low level, respectively, the inverters I3 and I4 generate low-level and high-level outputs, respectively. Then, the PMOS transistor P4 and NMOS transistors N3 and N4 are turned on and the multiplexers MUX1 and MUX2 generate high level and low level output signals, respectively. The latches L1 and L2 latch and invert the output signals of the multiplexers MUX1 and MUX2, respectively, thereby generating the pair of data DD and DDB of low and high level, respectively. On the other hand, when the pair of data DB and D are at the low level and at the high level, respectively, during a read operation, the inverters I3 and I4 generate high level and low level outputs, respectively. And then the NMOS transistors N1 and N2 and PMOS transistor P5 are turned on and the multiplexers MUX1 and MUX2 generate low level and high level output signals, respectively. The latches L1 and L2 latch and invert the output signals of the multiplexers MUX1 and MUX2, thereby generating the pair of data DD and DDB of high and low level, respectively.

That is, the dynamic/static converter converts the pair of data DB and D which are dynamic signals of pulse shape into the pair of data DD and DDB which are static signals, respectively. By doing so, the data output buffer at the next stage can stably latch the data according to the control signal KPIPE.

Figure 4:
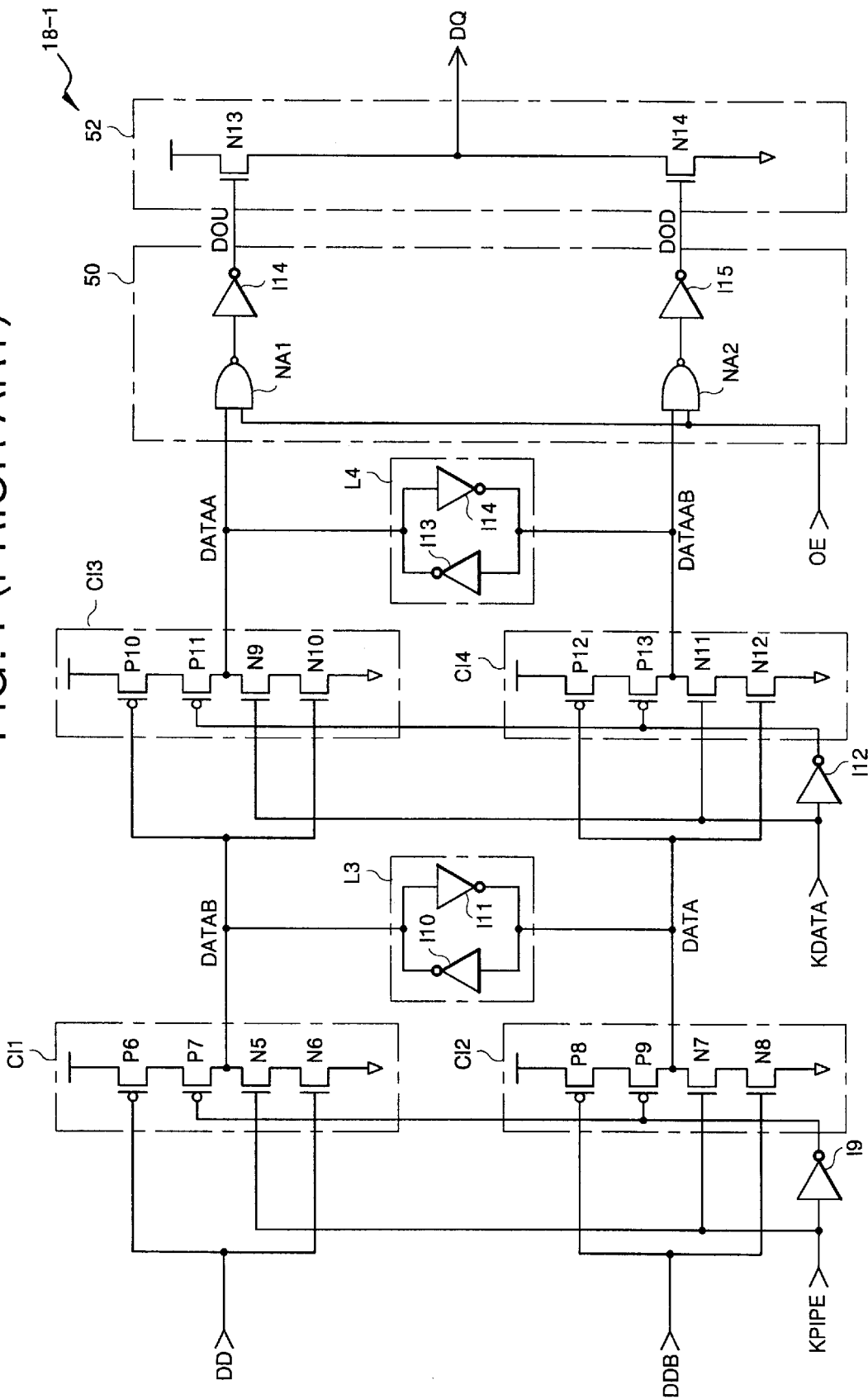
FIG. 4 is a circuit diagram of an embodiment of the data output buffer shown in FIG. 1.

FIG. 4 is a circuit diagram of an embodiment of the data output buffer shown in FIG. 1. As shown in FIG. 4, the data output buffer comprises inverters I9 and I12, clocked CMOS inverters CI1, CI2, CI3 and CI4, latches L3 and L4, logic ORing means 50 and an output driver 52. The detailed configuration and operation of the circuit of FIG. 4 are explained below.

The clocked CMOS inverter CI1 includes PMOS transistors P6 and P7 and NMOS transistors N5 and N6, and inverts the data DD in response to the control signal KPIPE of a high level, and outputs data DATAB. The clocked CMOS inverter CI2 comprises PMOS transistors P8 and P9 and NMOS transistors N7 and N8, and inverts the data DDB in response to the control signal KPIPE of a high level, and outputs data DATA. Latch L3 includes inverters I10 and I11, and is connected between the pair of output signal lines of the clocked CMOS inverters CI1 and CI2. Latch 13 latches the pair of (complementary) data signals DATAB and DATA.

The clocked CMOS inverter CI3 includes PMOS transistors P10 and P11 and NMOS transistors N9 and N10, and inverts the data DATAB in response to a control signal KDATA, and outputs data DATAA. The clocked CMOS inverter CI4 includes PMOS transistors P12 and P13 and NMOS transistors N11 and N12, and inverts the data DATA in response to the control signal KDATA, to output data DATAAB.

The latch L4 comprises inverters I13 and I14, and is connected between the pair of output signal lines of the clocked CMOS inverters CI3 and CI4, and latches the pair of data signals DATAA and DATAAB. The logic ANDing means 50 includes NAND gates NA1 and NA2 and inverters I14 and I15, and outputs the pair of latched data signals DATAA and DATAAB as the pair of data items DOU and DOD, respectively, in response to an output enable signal OE of a high level.

The output driver 52 comprises NMOS transistors N13 and N14, and generates high level output data DQ in response to the high level data DOU, and generates a low level output data DQ in response to the high level data DOD. Those of skill in the art will appreciate that the component data signals of data signal pairs DD, DDB; DATAB, DATA; DATAA, DATAAB; and DOU, DOD are complementary, i.e. generally they are logic inverses of one another, at least during a read operation of the memory device.

Figure 5:
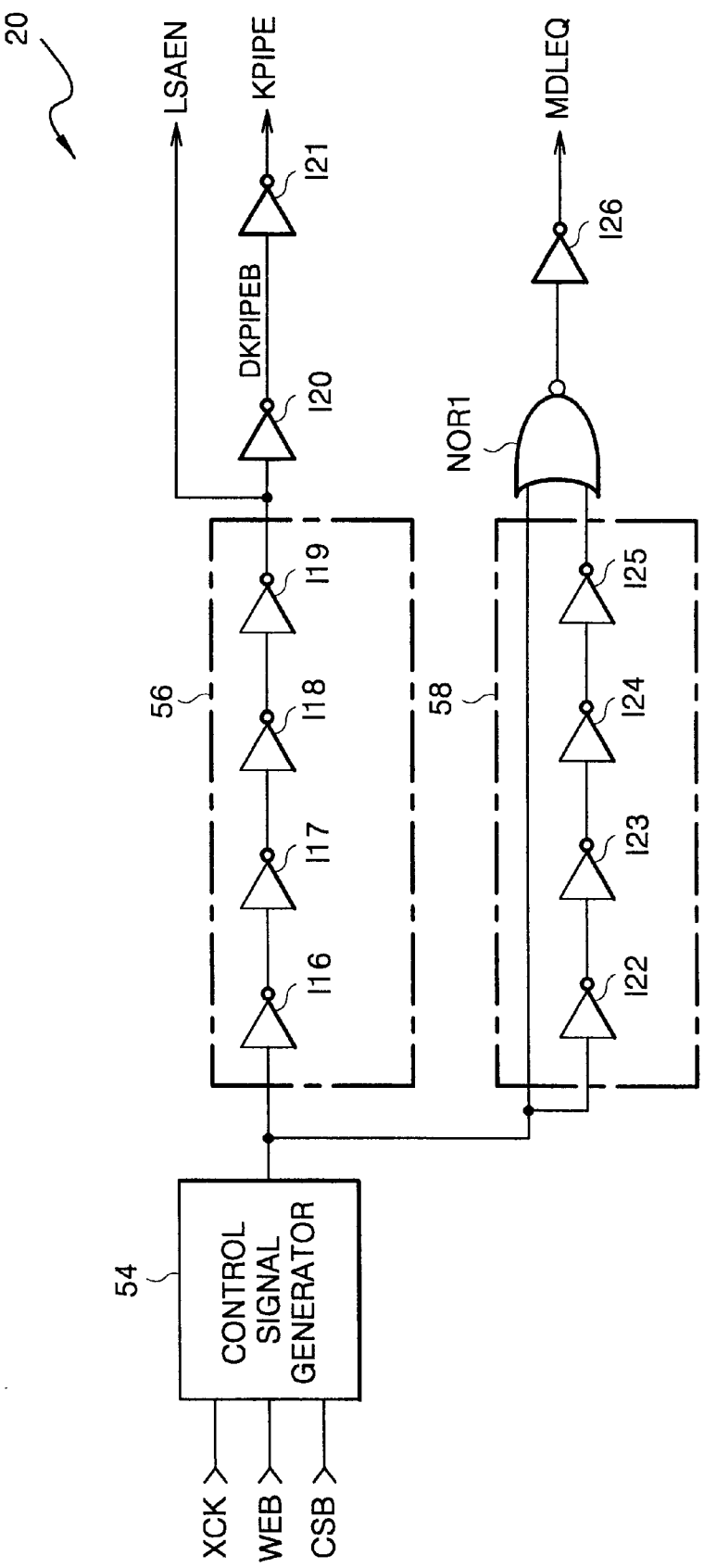
FIG. 5 is a diagram showing the configuration of an embodiment of the controller shown in FIG. 1.

FIG. 5 shows the construction of the controller shown in FIG. 1. As shown in FIG. 5, the controllger comprises a control signal generator 54; a delay circuit 56 including inverters I16, I17, I18 and I19; inverters I20 and I21; and a pulse width control circuit. The pulse width control circuit comprises a delay circuit 58 including inverters I22, I23, I24 and I25; a NOR gate NOR1; and an inverter I26. In the operation of the control circuit of FIG. 5, the control signal generator 54 generates a pulse signal having a predetermined pulse width in response to the clock signal XCK, inverted write enable signal WEB of high level and inverted chip select signal CSB of a low level, which are externally applied thereto. The delay circuit 56 delays the pulse signal transferred from the control signal generator 54, and generates the sense amplifier enable control signal LSAEN. The inverter I20 inverts the control signal LSAEN, and generates a signal DKPIPEB, and then inverter I21 inverts this signal DKPIPEB, and generates the data output buffer control signal KPIPE. The delay circuit 58 and NOR1 gate and inverter I26 expand the pulse width of the pulse signal output from the control signal generator 54 by a predetermined delay time to generate the main buffer control signal MDLEQ.

Figure 6:
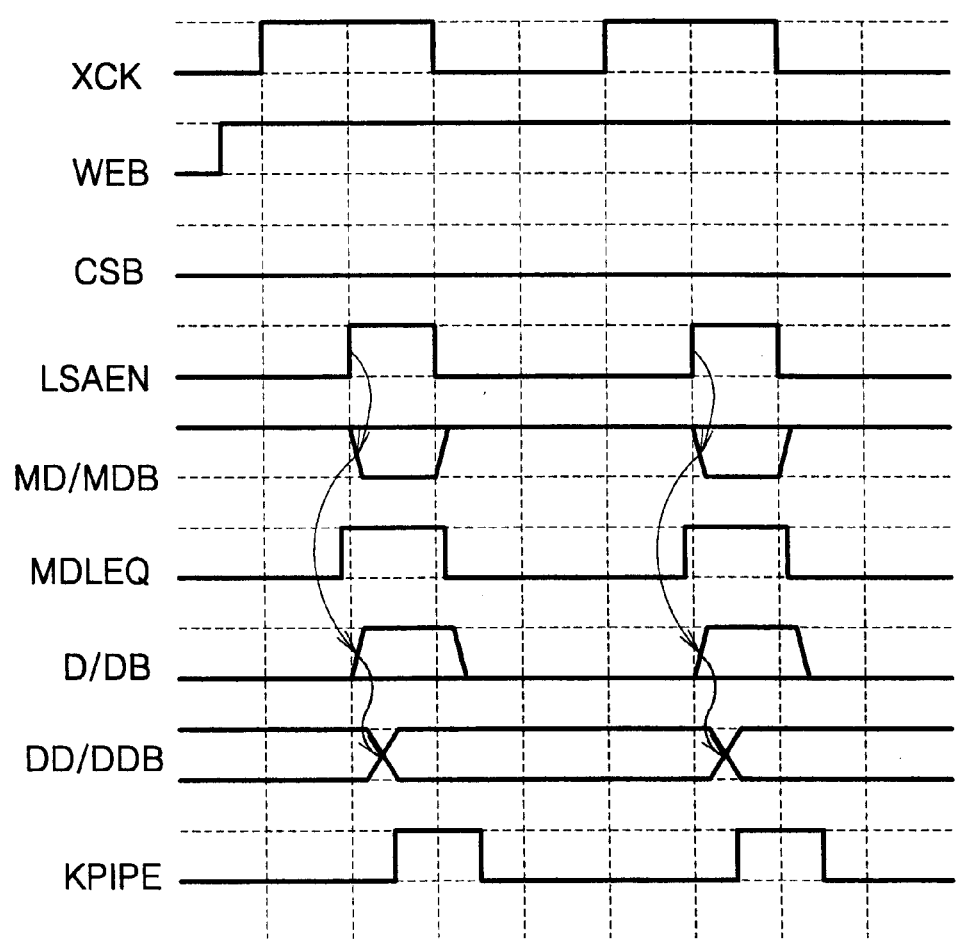
FIG. 6 is a timing chart for explaining the operation of the conventional semiconductor memory device shown in FIG. 1.

FIG. 6 is a timing chart for explaining the operation of the semiconductor memory device shown in FIG. 1. There will be explained below the read operation in the semiconductor memory device in case the clock signal XCLK, inverted write enable signal WEB of a high level and inverted chip select signal CSB of a low level are applied to the semiconductor memory device, and the memory cell array block 10-1 is selected to read data therefrom.

First of all, the controller 20 generates the control signals LSAEN, MDLEQ and KPIPE. The memory cell array block 10-1 transfers read data to the pairs of local data lines (LDL11, LDL11B), (LDL12, LDL12B), . . . , (LDL1k, LDL1kB). The sense amplifiers 12-11, 12-12, . . . , 12-1k amplify the data transmitted through the pairs of local data lines (LDL11, LDL11B), (LDL12, LDL12B), . . . , (LDL1k, LDL1KB) in response to the control signal LSAEN, and transfer the amplified data to the pairs of main data lines (MDL1, MDL1B), (MDL2, MDL2B), . . . , (MDLk, MDLkB), respectively. This operation is designated as MD/MDB in the timing chart of FIG. 6.

The main buffers 14-1, 14-2, . . . , 14-k buffer the data transferred through the pairs of main data lines (MDL1, MDL1B), (MDL2, MDL2b), . . . , (MDLk, MDLkB) in response to the control signal MDLEQ, and output the data as the pairs of data (D1, D1B), (D2, D2B), . . . , (Dk, DkB), respectively. These pairs of data (D1, D1B), (D2, D2B), . . . , (Dk, DkB) are dynamic data which are held at a low level when the control signal MDLEQ is at the low level, and converted into pairs of data having complementary levels when the control signal MDLEQ is transited to the high level. The aforementioned operation of the main buffers is designated as D/DB in the tiling chart of FIG. 6.

The dynamic/static converters 16-1, 16-2, . . . , 16-k convert the pairs of dynamic data(D1, D1B), (D2, D2B), . . . , (Dk, DkB) into the pairs of static data(DD1, DD1B), (DD2, DD2B), . . . , (DDk, DDkB), respectively. That is, the pairs of data(DD1, DD1B), (DD2, DD2B), . . . , (DDk, DDKB) are static data having the complementary levels respectively. This operation is shown as DD/DDB in the timing chart of FIG. 6. The data output buffers 18-1, 18-2, . . . , 18-k buffer the pairs of data(DD1, DD1B), (DD2, DD2B), . . . , (DDk, DDkB)respectively in response to the control signal KPIPE, and generate data output signals DQ1, DQ2, . . . , DQk respectively.

The above-mentioned conventional semiconductor memory device has the problem of undesirably low read data transmission speed because its read data is output through the sense amplifier, main buffer, dynamic/static converter and data output buffer. Accordingly, the dynamic/static converter for converting the dynamic data output from the main buffer into the static data imposes an undesirable delay in allowing the output data of the main buffer to be stably latched in the data output buffer.

Accordingly, the present invention provides a semiconductor memory device which can stably transmit data from the main buffer to the data output buffer at high speed without employing the dynamic/static converter disposed between the main buffer and data output buffer in order to reduce delay in transmission of read data. FIG. 7 is a block diagram of an embodiment of a semiconductor memory device according to the present invention.

As shown in FIG. 7, the semiconductor memory device of the present invention includes n memory cell array blocks 10-1, 10-2, . . . , 10-n, n groups of k sense amplifiers (12-11, 12-12, . . . , 12-1k), (12-21, 12-22, . . . , 12-2k), . . . , (12-n1, 12-n2, . . . , 12-nk), k main buffers 60-1, 60-2, . . . , 60-k, k data output buffers 18-1, 18-2, . . . , 18-k, k control signal generators 62-1, 62-2, . . . , 62-k and a controller 64. In FIG. 7, the blocks having the same constructions as those of the blocks of FIG. 1 are designated by the same numerals.

The explanation for the blocks having the same structures as those of the blocks of FIG. 1 will be omitted because they can be easily understood with reference to the explanation for FIG. 1. There will be described below only the operations of the main buffer blocks 60-1, 60-2, . . . , 60-k and KPIPE control signal generators 62-1, 62-2, . . . , 62-k, which are different from generally corresponding blocks shown in FIG. 1.

The main buffers 60-1, 60-2, . . . , 60-k buffer the signals from the pair of main data lines (MDL1, MDL1B), (MDL2, MDL2B), . . . , (MDLk, MDLkB), respectively, in response to the control signal MDLEQ, to generate the pairs of data (D1, D1B), (D2, D2B), . . . , (Dk, DkB), respectively, which are reset after a lapse of predetermined time. The control signal generators 62-1, 62-2, . . . , 62-k generate the control signals KPIPE1, KPIPE2, . . . , KPIPEk, respectively, which become high level in response to a signal DKPIPEB output from the controller 64, and which become low level when a voltage differential develops between the pairs of data (D1, D1B), (D2, D2B), . . . , (Dk, DkB), respectively.

In FIG. 7, though the semiconductor memory device is provided with the k control signal generators for the k data output buffers, it may have only one control signal generator for the k data output buffers, or one control signal generator for a predetermined number of data output buffers. The controller 64 externally receives the clock signal XCK, inverted write enable signal WEB of a high level and inverted chip select signal CSB of a low level, and generates the control signals LSAEN, MDLEQ and DKPIPEB. That is, the controller 64 generates the control signals LSAEN and MDLEQ similarly to the conventional one shown in FIG. 1, and generates the control signal DKPIPEB shown in FIG. 5. In other words, the controller of the semiconductor memory device shown in FIG. 7 has the configuration of the circuit of the controller shown in FIG. 5 except inverter I21 is omitted.

FIG. 8 is a circuit diagram of an embodiment of the main buffer of FIG. 7. The main buffer consists of PMOS transistors P14, P15 and P16 and self-reset drivers 70 and 72. In the operation of the main buffer, the main buffer control signal MDLEQ of a low level is generated when read command is not applied thereto, in the non-read operation state, the PMOS transistors P14, P15 and P16 are turned off, and accordingly the pair of data lines MDL and MDLB are reset to a high level. The self-reset drivers 70 and 72 generate the pair of data D and DB transitioned to a high level, respectively, when the pair of main data items MD and MDB on the pair of main data lines MDL and MDLB are transited to the high level.

During a read operation, the main buffer control signal MDLEQ of high level is generated, accordingly the PMOS transistors P14, P15 and P16 are turned off, and then the pair of main data MD and MDB transmitted through the pair of main data lines MDL and MDLB are transmitted to the self-reset drivers 70 and 72, respectively. The self-reset drivers 70 and 72 generate pulse signals at a low level when the pair of main data MD and MDB transition to a low level, and then reset to the high level after a lapse of predetermined time. That is, the pair of data D and DB corresponds to the pulse signals which are held in the high level state without any change when the pair of main data MD and MDB set at the high level, and becomes the low level when the pair of main data MD and MDB becomes the low level and then reset at the high level after a lapse of predetermined time.

FIG. 9 is a circuit diagram of an embodiment of the self-reset drivers 70, 72 shown in FIG. 8. While reset driver 70 for generating D in response to MD is shown, it will be understood that reset driver 72 of FIG. 8 may be similarly or identically configured to generate DB in response to MDB. The self-reset driver comprises a NOR gate NOR2; inverters I27, I28 and I31; PMOS transistors P17, P18 and P19; an NMOS transistor N15; a latch L5 including inverters I29 and I30; and a delay circuit 74 including inverters I32, I33 and I34. The circuit shown in FIG. 9 that corresponds to a general dynamic driver can perform its reset operation at high speed by enlarging the sizes of the pull-up transistor constructing the NOR gate NOR2, pull-down transistors constructing the inverter I27, and the PMOS transistor P17 compared to those of the other transistors. FIG. 9 shows the construction of the circuit which receives the main data MD and generates the data D. There is explained below the operation of the self-reset driver shown in FIG. 9.

When the read command is not applied to the semiconductor memory device, the main data MD is at a high level, and then the NOR gate NOR2 generates a low level signal and the inverter I27 generates a high level signal. Accordingly, the data D is held at the high level, the inverter I28 generates a low level signal, and the PMOS transistor P19 is turned on. The high level data D is delayed and inverted by the delay circuit 74 and generates a low level signal. Accordingly, the PMOS transistor P18 is turned on and applies a high level signal to the latch L5. The latch L5 inverts and latches the high level signal to generate a low level signal. The inverter I31 inverts this low level signal and generates a high level signal. Accordingly, the PMOS transistor P17 is turned off, the data D is held at the high level. That is, when the main data MD of the high level is applied, the data D is held at the high level state.

When main data MD of a low level is applied, the NOR gate NOR2 inputs main data MD of the low level and output signal of the latch L5 of the low level and generates a high level signal. The inverter I27 inverts the high level and generates a low level signal, thereby converting the high level data D into the low level. And, when the data D becomes the low level, the delay circuit 74 inverts and delays the low level signal and generates a high level signal. Accordingly, NMOS transistor N15 is turned on, the low level signal is latched in the latch L5. The latch L5 inverts and latches the low level signal and generates a high level signal. And the circuit composed of the NOR gate NOR2 and inverter I27 generates a high level signal. The inverter I31 inverts the high level signal and outputs a low level signal. Accordingly, the PMOS transistor P17 is turned on and the data D is reset to the high level.

Therefore, the self-reset driver of FIG. 9 maintains the high level data when the input data applied thereto is at the high level, and generates the pulse signal which becomes the low level and then is reset to the high level at high speed when the input data becomes the low level. That is, the semiconductor memory device can transmit the pair of main data MD and MDB at high speed by employing the self-reset driver as its main buffer to transmit the pair of main data MD and MDB at high speed.

FIG. 10 is a circuit diagram of an embodiment of the KPIPE control signal generator of FIG. 7. The control signal generator consists of a NAND gate NA3, a NOR gate NOR3, a delay circuit composed of inverters I35 and I36 and an NMOS transistor N16. The operation of the control signal generator is described below.

In the non-read operation state, the NOR gate NOR3 generates the control signal KPIPE of a low level because the signal DKPIPEB generated from the inverter I20 of the controller shown in FIG. 5 is at the high level. The NAND gate NA3 generates a low level signal because the pair of output data D and DB of the main buffer is the high level. The delay circuit 76 delays the low level signal and generates a low level signal, and then the NMOS transistor N16 is turned off.

When the read command is applied to the semiconductor memory device, the signal DKPIPE becomes the low level and the pair of output data D and DB of the main buffer are converted into complementary data of a high level and a low level. Accordingly, the NAND gate NA3 generates a high level signal, and the delay circuit 76 delays this high level signal and generate a high level signal. And then the NMOS transistor N16 is turned on, and generates the control signal KPIPE of a low level. That is, the control signal generator of FIG. 10 generates the control signal KPIPE of high level when the low level signal DKPIPEB is applied thereto, and generates the control signal KPIPE which becomes the low level after a lapse of predetermined time when the pair of data D and DB become the complementary levels.

FIG. 11 is a timing chart for explaining the operation of the semiconductor memory device according to the present invention. There will be described below the operation of the semiconductor memory device of the present invention in a case where the clock signal XCK, inverted write enable signal WEB of high level and inverted chip select signal CSB of low level are externally applied thereto and the memory cell array block 10-1 is selected to read data therefrom with reference to FIG. 11.

The controller 64 generates the control signals LSAEN, MDLEQ and DKPIPEB. The memory cell array block 10-1 transmits read data to the pairs of local data lines (LDL11, LDL11B), (LDL12, LDL12B), . . . , (LDL1k, LDL1kB). The sense amplifiers 12-11, 12-12, . . . , 12-1k amplify the data transferred through the pairs of local data lines (LDL11, LDL11B), (LDL12, LDL12B), . . . , (LDL1k, LDL1kB) in response to the control signal LSAEN, and transfer the amplified data to the pairs of main data lines (MDL1, MDL1B), (MDL2, MDL2B), . . . , (MDLk, MDLkB), respectively. This operation is designated as MD/MDB in the timing chart of FIG. 11.

The main buffers 60-1, 60-2, . . . , 60-k buffer the data transferred through the pairs of main data lines (MDL1, MDL1B), (MDL2, MDL2B), . . . , (MDLk, MDLKB) in response to the control signal MDLEQ, and transfer the data as the pairs of data(D1, D1B), (D2, D2B), . . . , (Dk, DkB), respectively. The pairs of data (D1, D1B), (D2, D2B), . . . , (Dk, DkB) are held at the high level states when the control signal MDLEQ is at the low level, and transition to, or reach (achieve), their complementary levels when the control signal MDLEQ becomes the high level. This operation is designated as D/DB in the timing chart of FIG. 11. That is, each of the main buffers 60-1, 60-2, . . . , 60-k maintains the high level data when the data MD or MDB has the high level, and generates the pair of data D and DB which firstly becomes the low level when the data MD or MDB is at the low level and then becomes the high level after a lapse of predetermined time.

The KPIPE control signal generators 62-1, 62-2, . . . , 62-k respectively generate the control signals KPIPE1, KPIPE2, . . . , KPIPEk which becomes the high level in response to the signal DKPIPE of low level output from the controller 64, and become a low level after a lapse of predetermined time when the pairs of data(D1, D1B), (D2, D2B), . . . , (Dk, DkB) transition to, or reach (achieve), their complementary levels. The data output buffers 18-1, 18-2, . . . , 18-k buffer the pairs of data(DD1, DD1B), (DD2, DD2B), . . . , (DDk, DDkb) in response to the control signal KPIPE and generate the data output signals DQ1, DQ2, . . . , DQk, respectively.

In the above-described embodiment, although the point of time at which the control signal KPIPE changes to the high level is similar to that in the conventional case, a higher speed can be realized because the main buffer 60-1 of the semiconductor memory device of the present invention can transmit the pair of data D and DB at higher speed than the conventional one. This is realized by controlling the delay time of the KPIPE signal, based on the signal DKPIPEB generated from the controller 64, via KPIPE control signal generators 62-1, 62-2, . . . , 62-k. In addition, generating the control signal KPIPE at an earlier point of time and with a shorter duration reduces the data input time. Thus, the points of time of generating the control signals KDATA and OE applied to the data output buffer can occur sooner, enabling higher-speed data read operation.

Accordingly, the semiconductor memory device and data read method thereof according to the present invention can transmit the data transferred through the main data lines at high speed by employing the self-reset driver as its main buffer. Furthermore, the semiconductor memory device of the present invention transmits the control signal, which is enabled at a timing of generation of the output data of the main buffer and then disabled after a lapse of predetermined time, to its data output buffer, improving its data read speed.

It will be apparent to those skilled in the art that various modifications and variations can be made in the semiconductor memory device and data read method in this device of the present invention without departing from the spirit or scope of the invention Thus, it is intended that the present invention cover the modifications and variations of this invention provided they come within the scope of the appended claims and their equivalents.

What is claimed is:

1. A semiconductor memory device, comprising:

n memory cell array blocks;

k sense amplifiers of n groups for respectively amplifying k pairs of output data output from each of the n memory cell array blocks and for respectively outputting the amplified k pairs of output data to main data lines, in response to a sense amplifier control signal;

k main buffers for, in response to a main buffer control signal, respectively resetting the k pairs of main data lines, and, when each of the pairs of data of the k pairs of main data lines achieve complementary levels, for respectively generating k pairs of data each of which has complementary levels, said k pairs of data being reset after a lapse of predetermined time;

k data output buffers for respectively receiving and buffering said k pairs of data generated from said k main buffers, in response to k data output buffer control signals, each of said k data output buffer control signals being generated responsive to a respective condition of a corresponding one of said k pairs of data by which data of said corresponding one of said k pairs of data have reached complementary levels;

k data output buffer control signal generating means for generating said k data output buffer control signals, each of said data output buffer control signals being collectively enabled in response to a common control signal and being independently disabled after a lapse of predetermined time from the point of time at which each of said pairs of data output from said k main buffers achieve the complementary levels; and a controller for generating said sense amplifier control signal, said main buffer control signal and said data output buffer control signals which are in pulse shape, in response to a clock signal, chip select signal and read command which are externally applied thereto.

2. The semiconductor memory device as claimed in claim 1, wherein each of said k main buffers comprises:

a reset circuit for resetting to a high level the pair of said main data lines in response to said main data line control signal of a low level; and a self-reset driver connected to the pair of said main data lines, for generating data of a high level when the data transmitted through said main data line is the high level in response to said main data line control signal of a high level, and for generating data which initially becomes a low level when the data transmitted through said main data line is the low level, and then is reset at the high level after a lapse of predetermined time.

3. The semiconductor memory device as claimed in claim 2, wherein said reset circuit comprises:
- a first PMOS transistor connected between said power voltage and said main data line, and turned on in response to said main data line control signal of a low level;
- a second PMOS transistor connected between said main data line and inverted main data line, and turned on in response to said main data line control signal of low level; and
- a third PMOS transistor connected between said inverted main data line and a ground voltage, and turned on in response to said main data line control signal of a low level.

4. The semiconductor memory device as claimed in claim 2, wherein said self-reset driver is a dynamic driver.

5. The semiconductor memory device in claimed in claim 4, wherein said dynamic driver comprises:
- a first NOR gate for NORing the data of said main data line or inverted main data line and an inverted feedback signal;
- a first inverter for inverting the output signal of said NOR gate;
- a fourth PMOS tansistor connected between the power voltage and output port of said first inverter, responding to a feedback signal;
- an inversion and delay circuit for inverting and delaying the output signal of said first inverter;
- a second inverter for inverting the data of said main data line or inverted main data line;
- an NMOS transistor connected between an output signal generating port and the ground voltage, responding to the output signal of the inversion and delay circuit;
- fifth and sixth PMOS transistors serially connected between the power voltage and said output signal generating port, responding to the output signals of said inversion and delay circuit and second inverter;
- a latch for inverting and latching the output signal of said NMOS transistor or fifth and sixth PMOS transistors, and generating said inverted feedback signal; and
- a third inverter for inverting the output signal of said latch and generating the feedback signal.

6. The semiconductor memory device as claimed in claim 1, wherein said data output buffer control signal generating means generate the data output buffer control signal which achieves a high level when a control signal of a low level is applied thereto, and changes to a low level after a lapse of predetermined time from the point of time at which the pair of output data of said main buffer achieves complementary levels.

7. The semiconductor memory device as claimed in claim 6, wherein said data output buffer control signal generating means comprise:
- a NAND gate for detecting complementary levels of the pair of output data of said main buffer;
- a delay circuit for inverting and delaying the output signal of said NAND gate;
- a reset transistor for resetting to a low level said data output buffer control signal, in response to the high level output signal of said delay circuit; and
- a second NOR gate for NORing the control signal and output signal of said delay circuit to set said data output buffer control signal at the high level.

8. A semiconductor memory device, comprising:
- a plurality of memory cell array blocks;
- a predetermined number of main buffers for resetting a predetermined number of pairs of main data lines corresponding to a predetermined number of pairs of data output from each of the plurality of memory cell array blocks in response to a main buffer control signal, and for generating a predetermined number of pairs of data of complementary levels when the data of each of the predetermined number of pairs of main data lines is of complementary level, the predetermined number of pairs of data being reset after a lapse of predetermined time;
- a predetermined number of data output buffers for respectively receiving and buffering said predetermined number of pairs of data generated from each of the predetermined number of main buffers, in response to a data output buffer control signal;
- data output buffer control signal generating means for generating said data output buffer control signal, said buffer control signal generating means being enabled in response to a control signal and being disabled after a lapse of predetermined time from the point of time at which each of the pairs of data output from said predetermined number of main buffers is of the complementary level, wherein plural data output buffer control signal generating means corresponding to the predetermined number of plural data output buffers are independently operable to enable and disable the plural data output buffers; and
- a controller for generating said main buffer control signal and said control signal which are in pulse shape, in response to a clock signal, chip select signal and read command which are externally applied thereto.

9. The semiconductor memory device as claimed in claim 8, wherein each of the predetermined number of main buffer comprises:
- a reset circuit for resetting to a high level the pair of said main data lines in response to said main data line control signal of low level; and
- a self-reset driver connected to the pair of said main data lines, for generating data of a high level when the data transmitted through said main data line is the high level in response to said main data line control signal of high level, and generating data which initially becomes a low level when the data transmitted through said main data line is the low level and then is reset at the high level after a lapse of predetermined time.

10. The semiconductor memory device as claimed in claim 9, wherein said reset circuit comprises:
- a first PMOS transistor connected between said power voltage and said main data line, and turned on in response to said main data line control signal of a low level;
- a second PMOS transistor connected between said main data line and inverted main data line, and turned on in response to said main data line control signal of low level; and
- a third PMOS transistor connected between said inverted main data line and a ground voltage, and turned on in response to said main data line control signal of low level.

11. The semiconductor memory device as claimed in claim 9, wherein said self-reset driver is a dynamic driver.

12. The semiconductor memory device as claimed in claim 8, wherein said data output buffer control signal generating means generate the data output buffer control signal which is rendered a high level when a control signal of low level is applied thereto and becomes a low level after a lapse of predetermined time from the point of time at which the pair of output data of said main buffer reach the complementary levels.

13. The semiconductor memory device as claimed in claim 12, wherein said data output buffer control signal generating means comprise:

a NAND gate for NANDing the pair of said output data of the main buffer;

a delay circuit for inverting and delaying the output signal of said NAND gate;

a reset transistor for resetting to a low level said data output buffer control signal, in response to the high level output signal of said delay circuit; and a NOR gate for NORing said control signal and output signal of said delay circuit to set said data output buffer control signal at the high level.

14. A data read method in a semiconductor memory device having a plurality of memory cell array blocks, the method comprising the steps of:

amplifying a predetermined number of pairs of data output from each of the plurality of memory cell array blocks in response to a first control signal generated in response to a read command, and generating a first pair of data;

resetting said first pair of data in response to a second control signal generated in response to the read command and generating a second pair of data changing its level when said first pair of data are transited to complementary levels, said second pair of data being reset after a lapse of predetermined time; and buffering and outputting said second pair of data in response to a fourth control signal, the fourth control signal being enabled in response to a third control signal when said second pair of data are transited to the complementary levels, and being disabled after a lapse of predetermined time.

* * * * *

UNITED STATES PATENT AND TRADEMARK OFFICE
CERTIFICATE OF CORRECTION

PATENT NO. : 6,295,244 B1 Page 1 of 1
DATED : September 25, 2001
INVENTOR(S) : Kim et al.

It is certified that error appears in the above-identified patent and that said Letters Patent is hereby corrected as shown below:

Column 5,
Line 63, "LDL1KB)" should read -- LDL1kB) --.

Column 6,
Line 12, "ti1ing" should read -- timing --.
Line 54, "on1y" should read -- only --.

Column 7,
Line 7, "on1y" should read -- only --.
Line 59, "en1arging" should read -- enlarging --.

Column 11,
Line 18, "in claimed" should read -- as claimed --.

Signed and Sealed this

Fourth Day of June, 2002

Attest:

Attesting Officer

JAMES E. ROGAN
Director of the United States Patent and Trademark Office